(12) United States Patent
Nightingale et al.

(10) Patent No.: US 6,404,215 B1
(45) Date of Patent: Jun. 11, 2002

(54) VARIABLE SPACING PROBE TIP ADAPTER FOR A MEASUREMENT PROBE

(75) Inventors: Mark W. Nightingale, Washougal, WA (US); R. Kenneth Price, Tigard; William Q. Law, Beaverton, both of OR (US)

(73) Assignee: Tektronix, Inc., Beaverton, OR (US)

( * ) Notice: Subject to any disclaimer, the term of this patent is extended or adjusted under 35 U.S.C. 154(b) by 12 days.

(21) Appl. No.: 09/715,375

(22) Filed: Nov. 16, 2000

Related U.S. Application Data

(60) Provisional application No. 60/226,719, filed on Aug. 21, 2000.

(51) Int. Cl.[7] ............................................... G01R 31/02
(52) U.S. Cl. ...................... 324/754; 324/72.5; 439/169; 439/482
(58) Field of Search ................................ 324/72.5, 149, 324/754, 758; 439/169, 174, 482, 912

(56) References Cited

U.S. PATENT DOCUMENTS

| | | | | |
|---|---|---|---|---|
| 4,209,742 A | * | 6/1980 | Bender et al. .............. 324/72.5 |
| 4,423,373 A | * | 12/1983 | LeCroy, Jr. ................. 324/72.5 |
| 4,721,903 A | * | 1/1988 | Harsch et al. .............. 324/72.5 |
| 5,488,313 A | * | 1/1996 | Gourse et al. .............. 324/754 |
| 6,023,171 A | * | 2/2000 | Boyette et al. ............. 324/754 |

* cited by examiner

Primary Examiner—Michael J. Sherry
Assistant Examiner—Minh N. Tang
(74) Attorney, Agent, or Firm—William K. Bucher

(57) ABSTRACT

A variable spacing probe tip adapter for a differential measurement probe has a measurement probe head with first and second probe tips extending from the probe head. Ribs and grooves formed in the probe head that extend radially from around each of the probe tips. Each of first and second first probing tips have an electrically conductive shaft that has a bore formed in one end for engaging the probe tips of the measurement probe. Each shaft has ribs and grooves formed therein that extend radially from the bore for engaging the corresponding grooves and ribs in the probe head. The other end of the conductive shaft tapers to a probing point with and a portion of the shaft toward the tapered end of the shaft being angled such that the probing tips. The conductive shafts are rotatable on measurement probe tips and locked into position by the engagement of the ribs and grooves in the probe head and the probing tips.

4 Claims, 3 Drawing Sheets

VARIABLE SPACING PROBE TIP ADAPTER FOR A MEASUREMENT PROBE

CROSS-REFERENCE TO RELATED APPLICATION

This application claims the benefit of the U.S. Provisional Application No. 60/226,719, filed Aug. 21, 2000.

BACKGROUND OF THE INVENTION

The present invention relates generally to probe adapters for measurement probes and more particularly to a variable spacing probe tip adapter usable with very high frequency differential measurement probes.

Probe tip adapters are accessories developed for measurement probes to allow probing to various type of electrical components. The adapters allow connections to square pins mounted on a circuit board, ground points on the circuit board, leads of surface mounted integrated circuit devices, and the like. The P6246 Active Differential Measurement Probe 10, manufactured and sold by Tektronix, Inc., Beaverton, Oreg. and assignee of the instant invention, has a measurement probe head 12 and first and second socket type probe tips 14 and 16 as shown in FIG. 1. The socket tips 14 and 16 have an overall length of 0.255 inches and a diameter of 0.065 inches. The socket bores have a diameter of 0.038 inches and a length of 0.255 inches. Various types of probe tip adapters are inserted into the socket to allow various types of probing.

One type of probe tip adapter for the above described differential measurement probe 10 is a dual probing tip variable spacing adapter 18. The adapter 18 has first and second probing tips 18 and 20 that are formed from a wire having a diameter that allows rotational movement of the probing tips within the socket type probe tips 14 and 16 of the measurement probe head 12. The probing tips 18 and 20 have first and second straight portions 24 and 26 that are offset by respective lateral transition portions 28 and 30. The probing tips 18 and 20 are ganged together using a non-conductive spacer 32. The non-conductive spacer 32 has first and second bores formed therein that have the same pitch geometry or center to center spacing as the socket type probe tips 14 and 16 in the measurement probe head 12. The probing tips 20 and 22 are secured in the spacer 32 by either an outwardly extending rib formed on the first straight portion 24 that engages the bore of the spacer 32 or by a non-conductive retainer inserted on the first straight portion 24 and positioned to engage the probe side of the spacer 32. Either retaining means allow rotational movement of the probing tips within the bore. The probing tips are rotatable within the socket type probe tips 14 and 16 and the spacer 32 to allow the pitch geometry of the probing tips to be changed to match the pitch geometry of the leads on integrated circuit devices.

Probe tip capacitance and inductance are major drawback to using socket type probe tip or tips in measurement probes. Tip capacitance and inductance limits the input bandwidth of the probe. With the electronic industry continuing to develop integrated and hybrid circuits operating at higher and higher gigahertz frequencies, a new type of measurement probe design is required that has substantially reduced probe tip capacitance and inductance. This requires reducing the probe tip length and diameter. Likewise, probe tip adapters are required for these low capacitance probes that have reduced length and diameter.

What is needed is a probe tip adapter that is compatible with a low capacitance measurement probe having a reduced size probing tip. The adapter should be adaptable to various integrated circuit lead pitch geometries while minimizing as much as possible additional probe tip capacitance and inductance by reducing the length and diameter of the adapters.

SUMMARY OF THE INVENTION

Accordingly, the present invention is to a variable spacing probe tip adapter for a differential measurement probe having a measurement probe head with first and second probe tips extending from the probe head. Ribs and grooves formed in the probe head that extend radially from each of the probe tips. Each of first and second offset probing tips have an electrically conductive shaft that has a bore formed in one end for engaging the respective probe tips of the measurement probe. Each shaft has a surface normal to the bore with ribs and grooves formed therein that extend radially from the bore for engaging the corresponding grooves and ribs in the probe head. The other end of the conductive shaft tapers to a probing point with a portion of the shaft toward the tapered end of the shaft being angled to offset the probing tip. The conductive shafts are rotatable on measurement probe tips and locked into position by the engagement of the ribs and grooves in the probe head and the probing tips. The grooves and ribs formed around the respective conductive shaft bores and the probe tips of the measurement probe provide selected probing point separation. Preferably the probing point separation matches standard integrated circuit lead pitch geometries of 0.025 inches, 0.050 inches, and 010 inches. The variable spacing probe tip adapter may also include a probing tip holder having first and second bores formed therein for receiving the first and second probing tips.

The objects, advantages and novel features of the present invention are apparent from the following detailed description when read in conjunction with appended claims and attached drawings.

DETAILED DESCRIPTION OF THE PREFERRED EMBODIMENT

Figure 1:
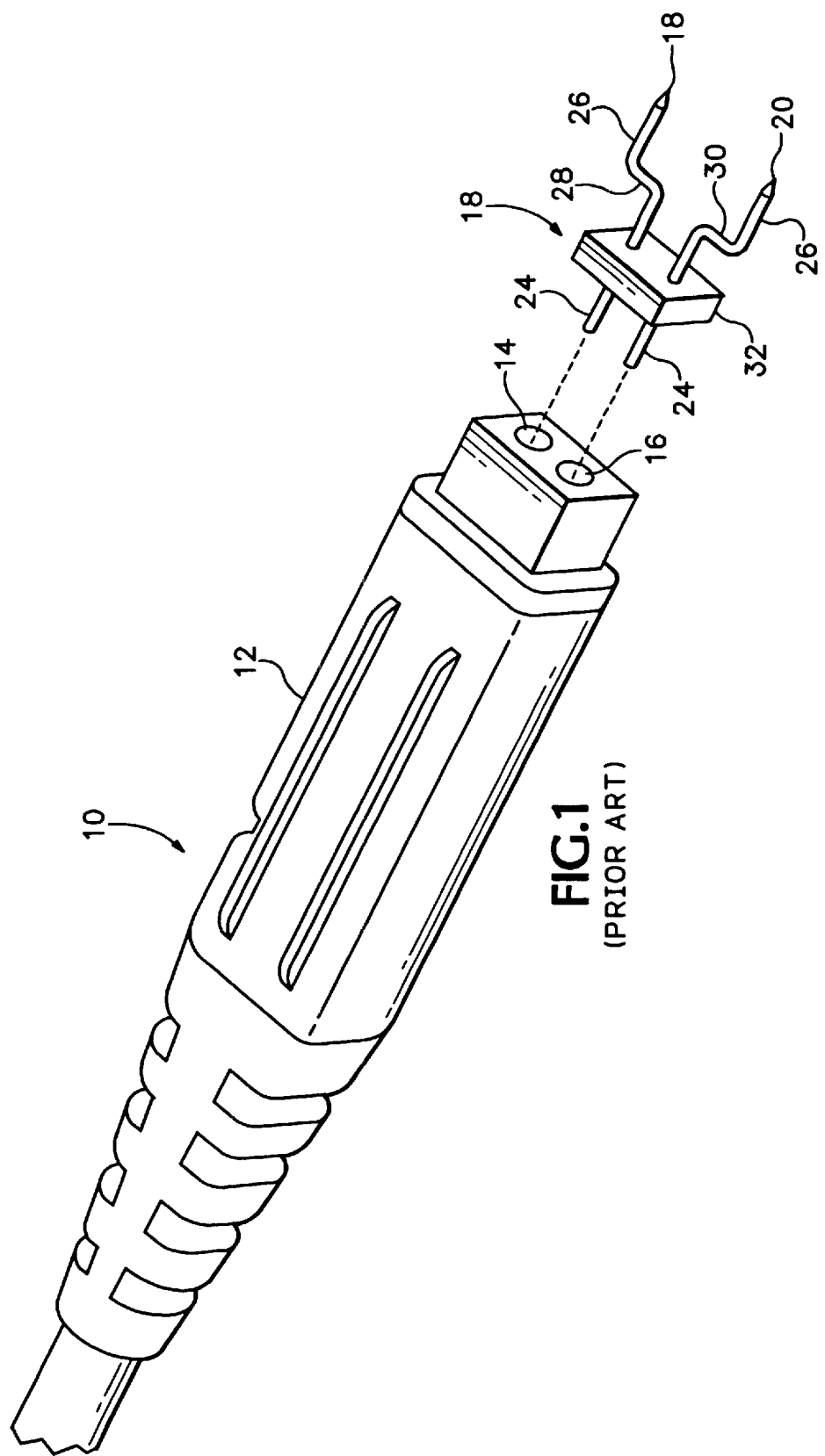
FIG. 1 is a prior art differential measurement probe having socket type probe tips and a variable spacing probe tip adapter.
Figure 2:
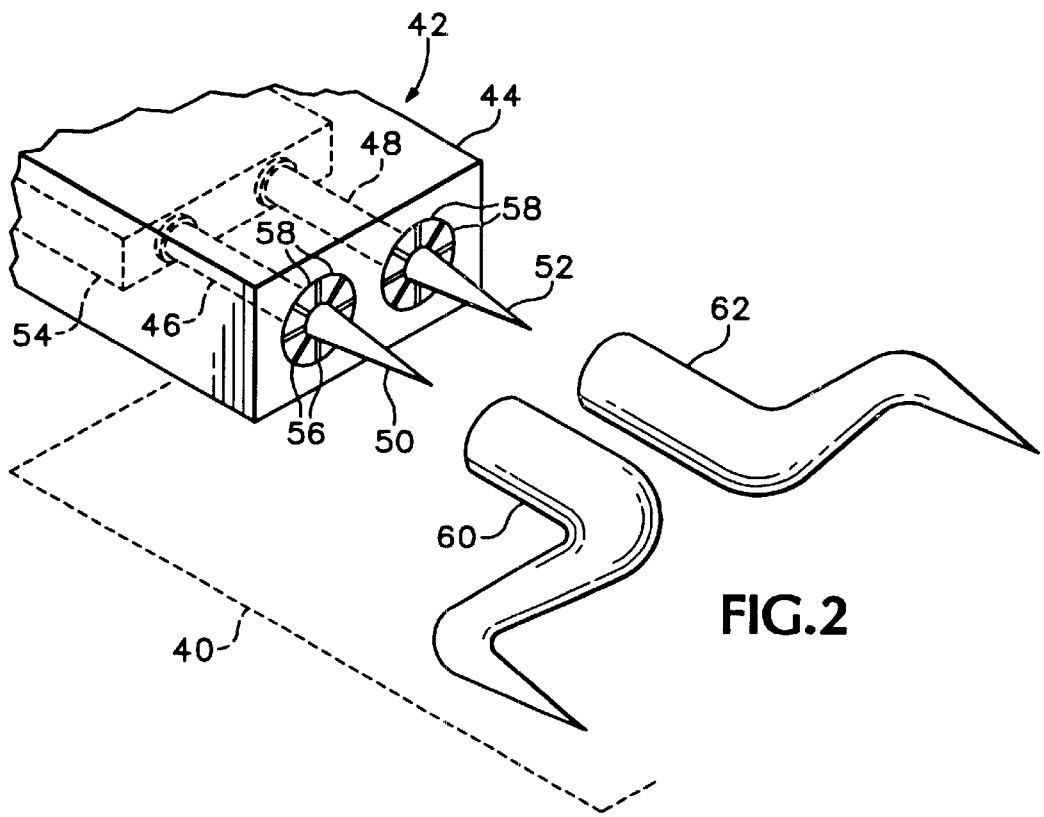
FIG. 2 is a perspective view of the variable spacing probe tip adapter according to the present invention.

Referring to FIG. 2, there is shown a perspective view of the variable spacing probe tip adapter 40 according to the present invention. The variable spacing probe tip adapter 40 includes a measurement probe head 42 of a differential measurement probe having nose portion 44 having parallel bores 46 and 48 formed therein that receive first and second probing tips 50 and 52. One end of each of the probing tips 50 and 52 engage a substrate 54 disposed within the probe head 42. The other end of each of the probing tips 50 and 52 is tapered to a point and extends from the nose portion 44.

The bores 46 and 48 have a diameter in the range of 0.019 inches and a length in the range of 0.060 inches. The center to center spacing or pitch geometry between the bores 46 and 48 is in the range of 0.100 inches. The probing tips 50 and 52 have a diameter of approximately 0.018 inches and an overall length in the range of 0.204 inches with the probing tips extending from the end of the nose portion 44 in the range of 0.107 inches. Ribs and grooves 56 and 58 are formed in the nose portion 44 around each of the probing tips 50 and 52 that radiate outward normal to the probing tips. In the preferred embodiment the ribs and grooves have a radial length in the range of 0.011 to 0.013 inches. The height differential between the tops of the ribs 56 and the bottom of the grooves 58 is sufficient to lock offset probing tips 60 and 62 of the variable spacing probe tip adapter 40 in selected positions.

Figure 3:
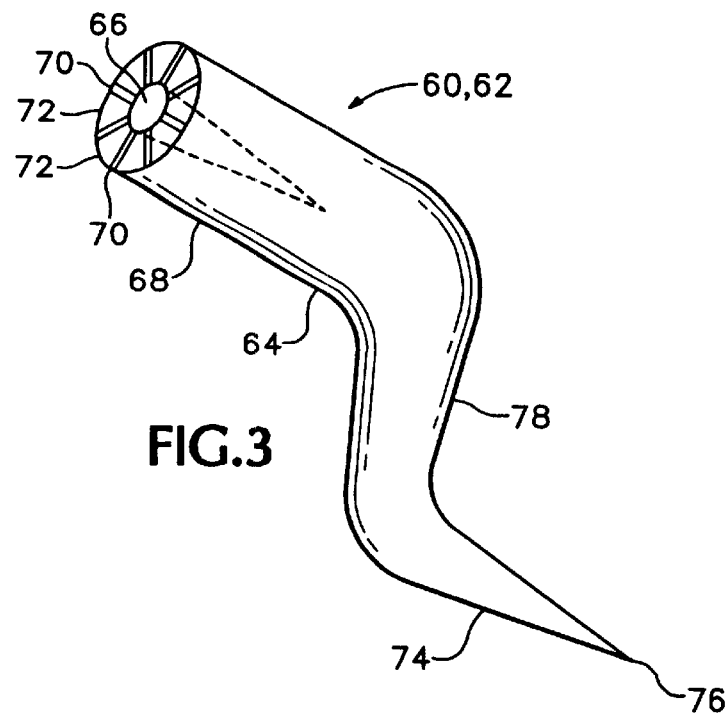
FIG. 3 is a perspective view of the offset probing tips with ribs and grooves therein for the variable spacing probe tip adapter according to the present invention.

Referring to FIG. 3, there is shown a perspective view of one of the offset probing tips 60 and 62 of the variable spacing probe tip adapter 40 of the present invention. The offset probing tip 60, 62 is formed of an electrically conductive shaft 64 having a bore 66 formed in one end 68 that engages a probing tip 50, 52 of the differential measurement probe. The diameter of the bore end of the shaft 68 is sufficient to form ribs 70 and grooves 72 that radiate outward normal to the bore 66. The height differential between the tops of the ribs 70 and the bottom of the grooves 72 is preferably the same as the height difference between ribs 56 and grooves 58 to lock offset probing tips 60 and 62 in selected positions. The other end 74 of the electrically conductive shaft 64 tapers to a point 76. The shaft 64 has a transitional portion 78 that offsets the tapered point 76 of the shaft 64 from bore end of the shaft 68. The offset is sufficient to allow points 76 of the offset probing tips 60 and 62 to be rotated to various probing tip separations that match various pitch geometries or lead spacing of integrated circuit leads. Such pitch geometries include 0.025, 0.050, 0.100 and the like.

The electrically conductive shaft 64 is preferably machined from an electrically conductive blank made of beryllium-copper, brass or similar type electrically conductive material. The bore 66 is machined into one end of the blank. Preferably, the bore is formed for mating with the probing tips 50 and 52. The other end of the blank is machined using a lathe or similar type of machinery, such as a grinder, to form the tapered probing point 76. The prepared electrically conductive shaft blank is heat treated and gold plated over and plated layer of sulfamate nickel. Depending on the type of material used for the blanks, heat treating may not be necessary. For example, the blank may be formed of brass, which has sufficient hardness and does not benefit from heat treating. On the other hand, a blank is formed of beryllium copper requiring heat treating to increase the hardness.

The electrically conductive shaft 64 has an overall diameter at the bore 66 in the range of 0.040 to 0.045 inches with the bore 66 diameter at the opening being approximately 0.018 inches to match the diameter of the probing tips 50 and 52 at the nose portion 44 interface. The ribs and grooves 70 and 72 have a radial length in the range of 0.011 to 0.013 inches. The bore 66 has an overall length in the range of 0.110 inches. The offset probing tips 60 and 62 are held on the probing tips 50 and 52 by the friction fit of the probing tips 50 and 52 in the bore 66. The overall length of the offset probing tips 60 and 62 is in the range of 0.300 to 0.350 inches.

Figure 4:
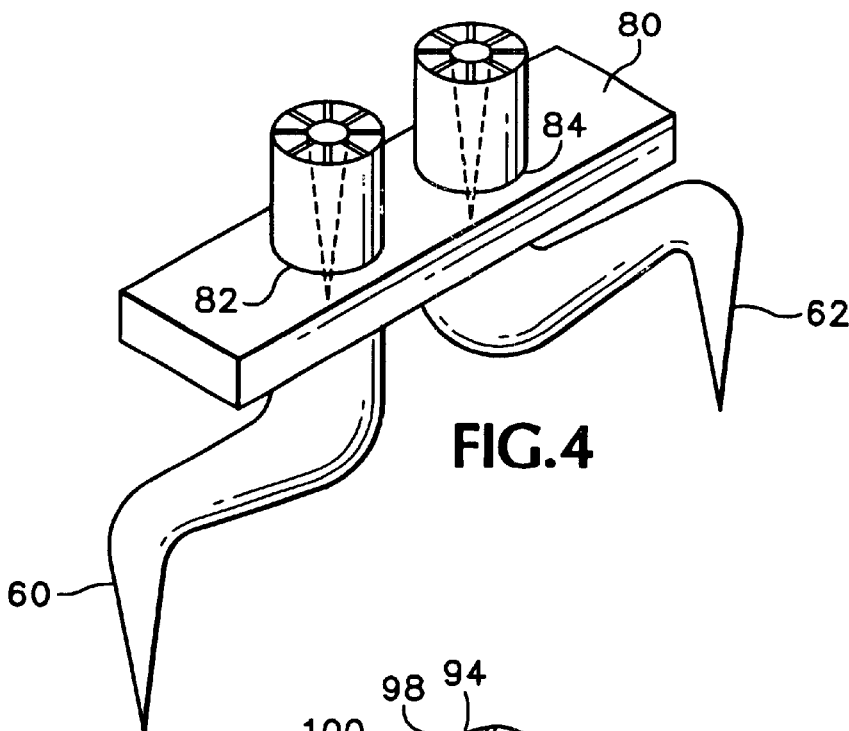
FIG. 4 is a perspective view of ganged offset probing tips of the variable spacing probe tip adapter according to the present invention.

Referring to FIG. 4, there is shown the offset probing tips 60 and 62 ganged together using a probing tip holder 80. The probing tip holder is formed of a non-conductive material, such as ABS plastic or the like. The probe tip holder has first and second bores 82 and 84 formed therein that have a center to center spacing that matches the center to center spacing of the probing tips 50 and 52 of the differential measurement probe. The bore end 68 of the offset probing tips 60 and 62 are inserted into the bores 82 and 84 to a point above the transitions 78 in the offset probing tips 60 and 62. An outwardly extending rib may be formed on the shaft 64 that engages the inside of the bores 82 and 84 to secure the probing tips 60 and 62 in the holder 80. The offset probing tips 60 and 62 are positioned on the probing tips 50 and 52 with the ribs 70 of the offset probing tips 60 and 62 nesting in the grooves 58 in the nose portion 44 of the measurement probe head 42. Likewise, the ribs 56 in the nose portion 44 nest in the grooves 72 in the offset probing tips 60 and 62. The offset probing tips 60 and 62 are rotatable about the probing tips 50 and 52 with the ribs 56 and 70 and grooves 58 and 72 locking the offset probing tips 60 and 62 various rotated positions.

The offset probing tip holder 80 has a length in the range of 0.300 inches, a width in the range of 0.190 inches and a height of 0.150 inches. The bores 82 and 84 have a diameter in the range of 0.040 to 0.045 inches.

Figure 5:
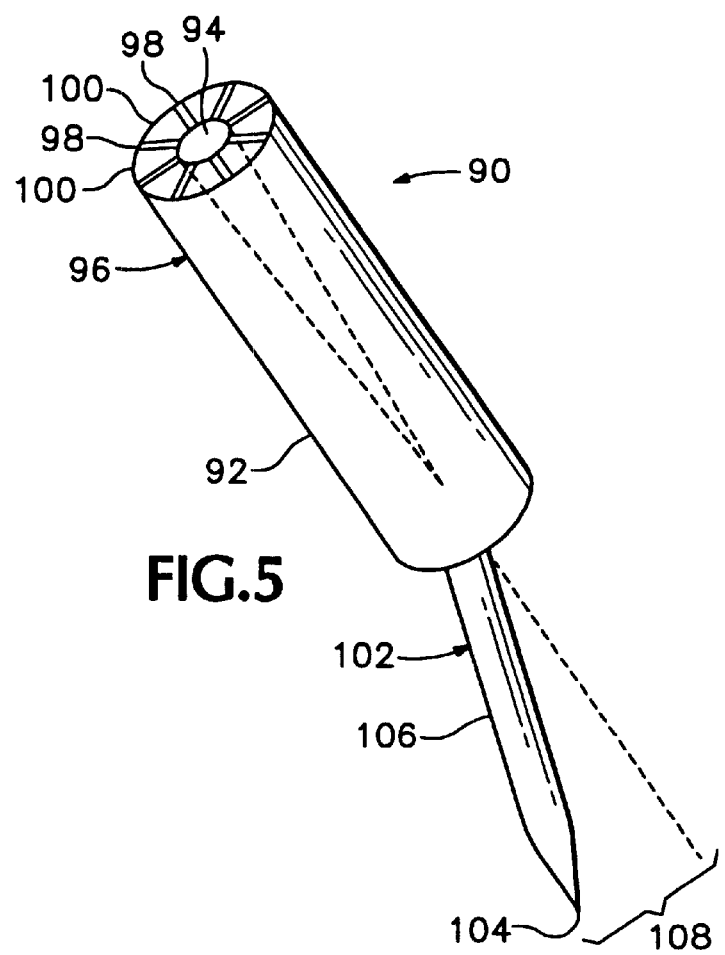
FIG. 5 is a perspective view of an angled offset probing tip for the variable spacing probe tip adapter of the present invention.

Referring to FIG. 5, there is shown an alternative offset probing tip 90 for the variable spacing probe tip adapter of the present invention. The angled offset probing tip 90 is formed from an electrically conductive shaft 92 having a bore 94 formed in one end 96 that engages a probing tip 50, 52 of the differential measurement probe. The bore 94 has the same dimensions as the bore for the previously described offset probing tips 60 and 62. Radiating ribs and grooves 98 and 100 are formed around the bore 94 in the same manner as described for the offset probing tips 60 and 62. The other end 102 of the shaft 92 is machined to produce a probing tip 104 having a shaft 106 with a diameter in the range of 0.018 inches. In the preferred embodiment, the deflection distance of the probing tip 104 from the center line of the shaft 92 is approximately 0.040 inches as represented by dimension length 108. The overall length of the angles offset probing tip 90 is in the range of 0.235 inches. The angled offset probing tip is heat treated, if necessary, and plated in the manner previously described.

A variable spacing probe tip adapter has been described having offset probing tips engaging probing tips in the measurement probe head. Each offset probing tip has a bore formed in one end that is dimensioned to frictionally engage the probing tips. Both the measurement probe head and the offset probing tips have radiating ribs and grooves formed around the respective probe tops and the bores. The offset probing tips are rotatable around the probing tips to various probe tip spacings with the ribs and grooves of the probe head and offset probing tips nesting together to lock the offset probing tips at the spacings. The offset probing tips may be ganged together using a non-conductive probe tip holder. The variable spacing probe tip adapter may also be configured using angled offset probing tips.

It will be obvious to those having skill in the art that many changes may be made to the details of the above-described embodiments of this invention without departing from the underlying principles thereof. The scope of the present invention should, therefore, be determined only by the following claims.

What is claimed is:

1. A variable spacing probe tip adapter for a differential measurement probe comprising:

a measurement probe head having first and second probe tips extending therefrom with the probe head having ribs and grooves formed in the probe head that extend radially from each of the probe tips; and first and second offset probing tips with each probing tip having an electrically conductive shaft with the shaft having a bore formed in one end thereof for engaging the probe tips of the measurement probe head and the other end of the shaft tapering to a probing point with a portion of the shaft toward the tapered end of the shaft being offset, the shaft having a surface normal to the bore with ribs and grooves formed therein that extend radially from the bore that nest in the corresponding grooves and ribs in the probe head such that the offset probing tips are rotatable on the measurement probe tips and locked into position by the engagement of the ribs and grooves in the probe head and the probing tips.

2. The variable spacing probe tip adapter as recited in claim 1 wherein the grooves and ribs are formed around the respective probing tips and the probe tips of the measurement probe head to provide selected probing point separation.

3. The variable spacing probe tip adapter as recited in claim 2 wherein the probing point separation is 0.025 inches, 0.050 inches, and 0.010 inches.

4. The variable spacing probe tip adapter as recited in claim 1 further comprising a probing tip holder having first and second bores formed therein for receiving the first and second probing tips.

* * * * *